United States Patent [19]

Mullen, III

[11] Patent Number: 4,878,851

[45] Date of Patent: Nov. 7, 1989

[54] ELECTRICAL SOCKET APPARATUS WITH TEMPORARY HOUSING

[75] Inventor: William B. Mullen, III, Boca Raton, Fla.

[73] Assignee: Motorola, Inc., Schaumburg, Ill.

[21] Appl. No.: 293,617

[22] Filed: Jan. 4, 1989

Related U.S. Application Data

[63] Continuation of Ser. No. 92,351, filed as PCT US87/01358 on Jun. 11, 1987, published as WO88/10014 on Dec. 15, 1988, abandoned.

[51] Int. Cl.⁴ .............................................. H05K 1/00
[52] U.S. Cl. ...................................... 439/83; 439/81; 439/876
[58] Field of Search .............................. 439/55, 78–84, 439/874, 876; 29/839, 840, 843

[56] References Cited

U.S. PATENT DOCUMENTS

| | | |
|---|---|---|
| 3,338,499 | 8/1967 | Gilbert . |
| 3,681,744 | 1/1972 | Olsson . |
| 3,997,237 | 12/1976 | White .................................. 439/876 |
| 4,115,157 | 9/1978 | Packer .................................. 148/23 |
| 4,269,870 | 5/1981 | Boynton ............................... 148/23 |
| 4,442,938 | 4/1984 | Murphy . |
| 4,478,650 | 10/1984 | Zado ..................................... 148/23 |
| 4,701,224 | 10/1987 | Zado ..................................... 148/23 |

FOREIGN PATENT DOCUMENTS 2094072A 9/1982 United Kingdom .

Primary Examiner—David Pirlot
Attorney, Agent, or Firm—Daniel K. Nichols; Juliana Agon

[57] ABSTRACT

An electrical socket is provided which includes a connector element to which a soluble temporary housing is attached. The socket is suitable for mounting on a printed circuit board or other substrate. The temporary housing provides a handle which an automatic component placement machine can grip. Once the socket is installed in an aperture in the printed circuit board, the housing is removed via solvent to free-up space on the board.

4 Claims, 6 Drawing Sheets

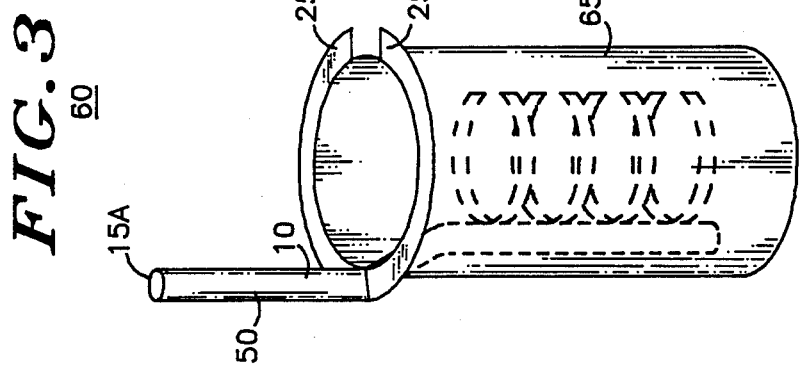
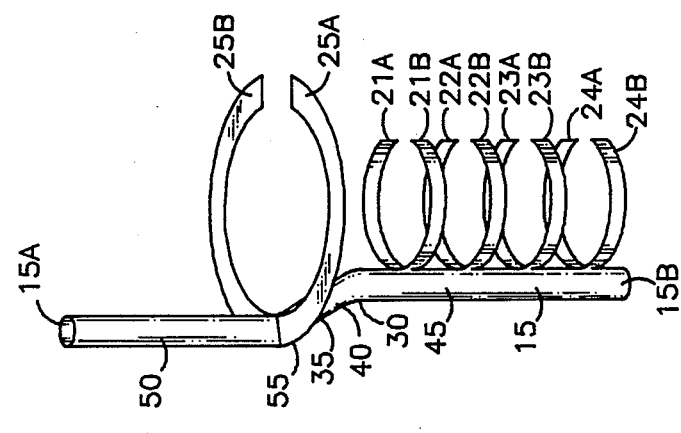
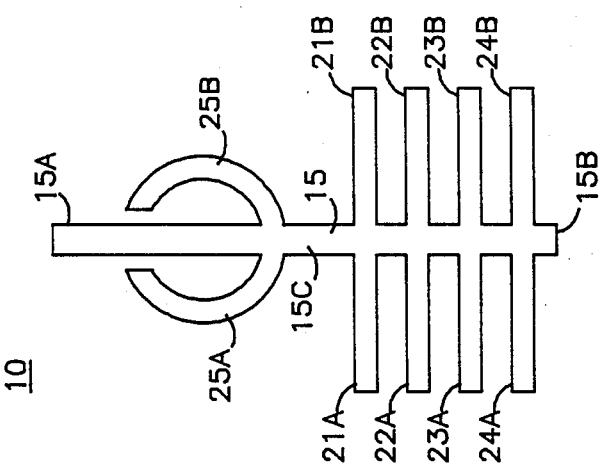

ELECTRICAL SOCKET APPARATUS WITH TEMPORARY HOUSING

This is a continuation of application Ser. No. 092,351, filed as PCT US87/01358 on Jun. 11, 1987, published as WO88/10014 on Dec. 15, 1988, and now abandoned.

BACKGROUND OF THE INVENTION

This invention relates in general to plugs and sockets which are used for electrical interconnection purposes. More particularly, the invention relates to sockets which are mounted on printed circuit boards and other substrates.

Unfortunately, despite continued efforts toward miniaturization, conventional sockets still tend to consume relatively large amounts of volume in both the vertical and horizontal dimensions with respect to the printed circuit boards on which such sockets are mounted.

BRIEF SUMMARY OF THE INVENTION

One object of the present invention is to provide a socket for a printed circuit board or other substrate which consumes a minimal amount of volume on the substrate.

Another object of the present invention is to provide a socket which includes a temporary housing which can be removed to free-up valuable space on a printed circuit board or other substrate.

In one embodiment of the invention, a socket is provided which includes a connector element for receiving and making a connection to an electrical lead. A soluble housing is attached to the connector element for temporarily housing said connector element. The housing is removable from the connector element via solvent once the connector element is inserted into an aperture in the substrate.

The features of the invention believed to be novel are specifically set forth in the appended claims. However, the invention itself, both as to its structure and method of operation, may best be understood by referring to the following description and the accompanying drawings.

BRIEF DESCRIPTION OF THE DRAWINGS

FIG. 1 is a representation of the connector socket of the invention in an early stage of fabrication.

FIG. 2 is a representation of the connector socket of the invention after tooling has been used to shape the connector.

FIG. 3 is a representation of the connector socket of FIG. 2 after a temporary housing has been applied to the connector.

DETAILED DESCRIPTION OF THE INVENTION

Figure 4:
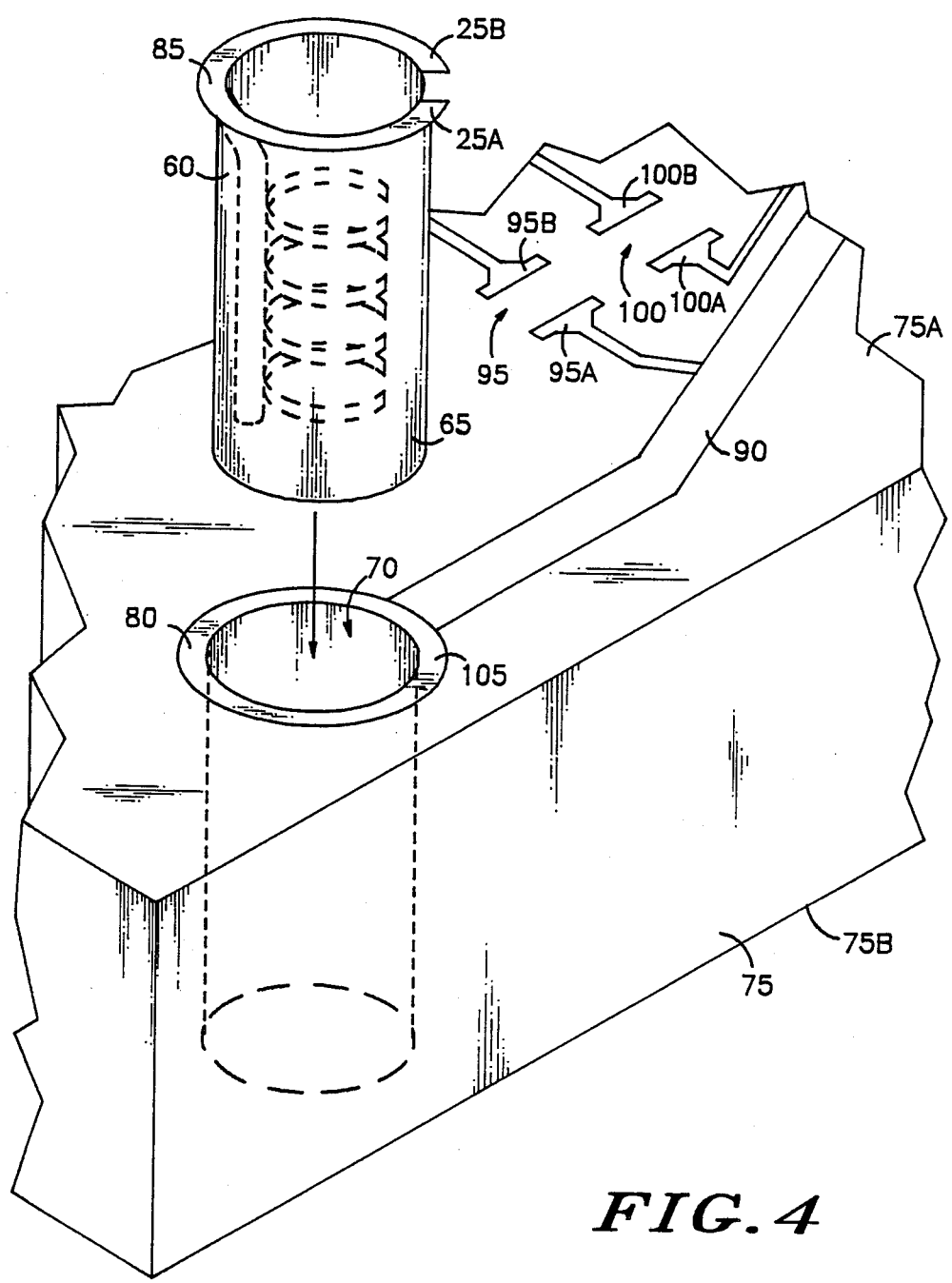
FIG. 4 is a perspective view of the connector of the invention shown prior to insertion in an aperture of a substrate.

Turning now to FIG. 1, one connector element which is used in the socket of the present invention is shown as connector element 10. Connector element 10 includes a central spine 15 having opposed ends 15A and 15B and a center 15C. A plurality of arm pairs 21A-21B, 22A-22B, 23A-23B and 24A-24B extend radially outward from spine 15 in the region of spine 15 between end 15B and center 15C. Connector element 10 further includes arms 25A and 25B which are each substantially semi-circularly shaped. One end of each of arms 25A and 25B is connected to spine 15 between end 15A and center 15C as shown in FIG 1. Connector element 10 is fabricated from electrically conductive material by a stamping or metal cutting process.

As shown in FIG. 2, arm pairs 21A-21B, 22A-22B, 23A-23B and 24A-24B are shaped by appropriate tooling into the form of semicircles. When so formed, arms 21A, 22A, 23A and 24A face arms 21B, 22B, 23B and 24B, respectively, in a manner which enables the arms to capture a connector lead therein.

Spine 15 is bent at 30 and 35 to bring the plane of arm pair 25A-25B substantially parallel with the plane of the other arm pairs 21A-21B, 22A-22B, 23A-23B and 24A-24B. An angled portion 40 is thus formed in spine 15. The lower portion of spine 15 to which arm pairs 21A-21B, 22A-22B, 23A-23B and 24A-24B are attached is now referred to as lower spine 45. The portion of spine 15 above arm pair 25A-25B is now referred to as upper spine 50. Upper spine 50 is bent at 55 where it meets arm pair 25A-25B such that upper spine 50 is in a plane substantially parallel with lower spine 45.

FIG. 3 shows the connector socket 60 formed by attaching a temporary housing 65 to the portion of connector element 10 below arm pair 25A-25B. Housing 65 is shaped to fit into an aperture 70 in a circuit board or other substrate 75 as shown in FIG. 4. Housing 65 is also shaped to permit an automatic parts placement machine, that is, a so-called "pick and place" machine, to pick up socket 60 by gripping housing 65. That is, housing 65 provides a handle which an automatic parts placement machine can grip. In this embodiment of the invention, housing 65 exhibits a cylindrical shape to facilitate placement in the cylindrical aperture 70 of FIG. 4. Those skilled in the art will appreciate that the cylindrical shape of housing 65 is described as an example and that other geometries for 65 can be selected for housing 65 as long as the selected geometry is capable of being gripped by an automatic parts placement machine, or alternatively, is capable of being manually handled.

Figure 5:
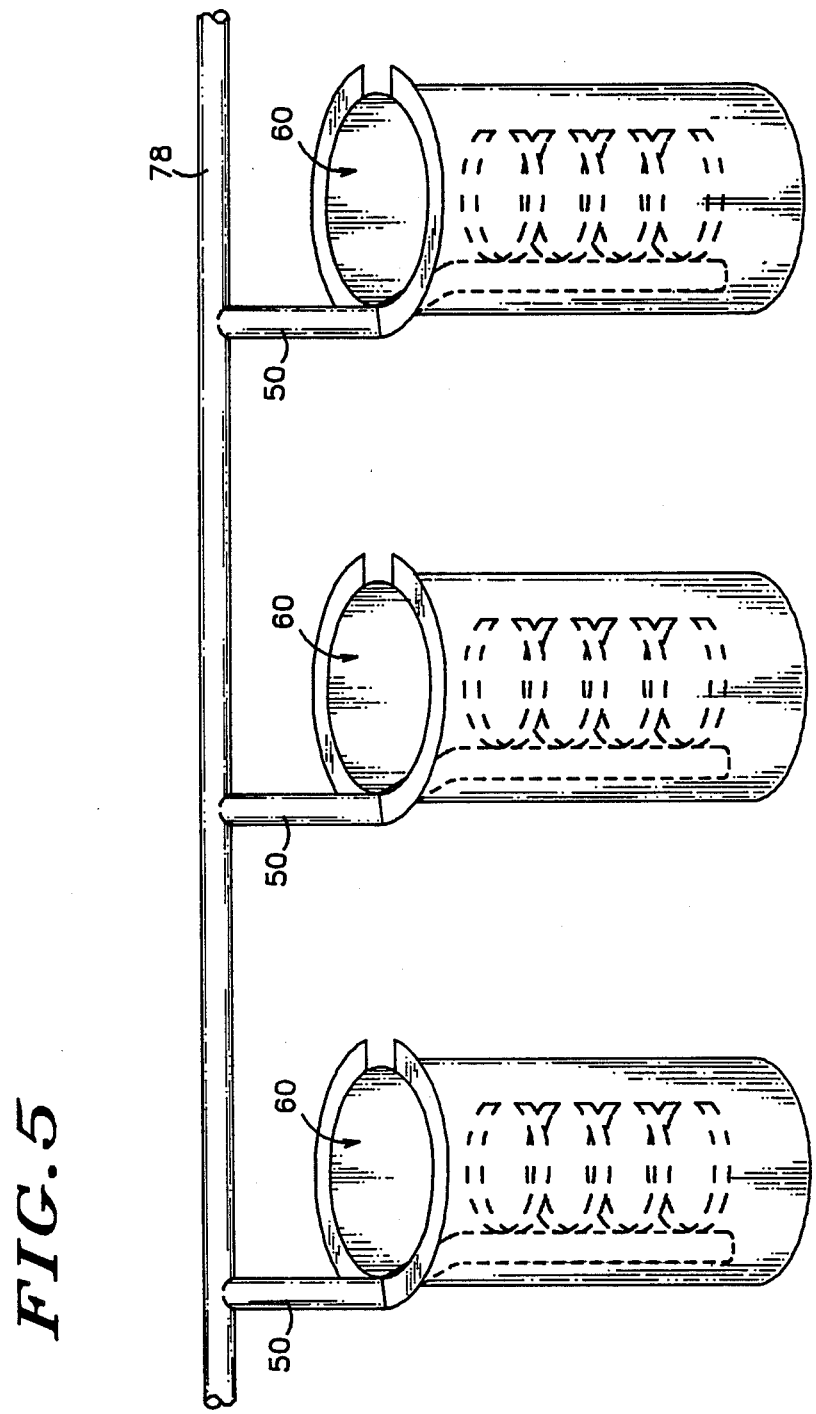
FIG. 5 is a representation of several of the connector sockets of FIG. 3 shown attached to a common bar or reel.

For convenience of use with automatic parts placement machines, connector sockets 60 are fabricated in a reel 78 as shown in FIG. 5. That is, a plurality of sockets 60 are connected to a common reel 78 by attaching the upper spines 50 of sockets 60 to reel 78 at spaced intervals. The automatic parts placement machine shears off upper spine 50 at the time of insertion into substrate 75 as shown in FIG. 4.

Temporary housing 65 is fabricated from a soluble material, for example TC-561 manufactured by Techform Laboratories. Housing 65 is molded onto the portion of socket 60 below arm pair 25A-25B. Alternatively, the portion of socket 60 below arm pair 25A-25B is conformally coated with soluble material to form housing 65.

As mentioned briefly above, FIG. 4 shows a substrate 75 with an aperture 70 into which socket 60 is to be inserted. For purpose of this example, it will be assumed that substrate 75 is a printed circuit board including opposed surfaces 75A and 75B. A land or ring 80 of electrically conductive material is situated on surface 75A surrounding the opening of aperture 70 onto surface 75A. Ring 80 is shaped to mate with arm pair 25A-25B when socket 60 is inserted into aperture 70. Arm pair 25A-25B forms a rim 85 which supports socket 60 when socket 60 is inserted into aperture 70.

A conductive runner 90 is shown connected to ring 80 on surface 75A to illustrate that socket 80 can be connected to other circuit elements on substrate 75 via such runners. Mounting sites 95 and 100 are also shown on surface 75A for receiving surface mounted devices thereon. Mounting site 95 includes a pair of conductive lands 95A and 95B for receiving a surface mounted device. Mounting site 100 also includes conductive lands 100A and 100B for receiving a surface mounted device.

FIG. 4, and 6-9 illustrate the method of placement of socket 10 in aperture 70 on printed circuit board 75 and removal of temporary housing 65. Returning momentarily to FIG. 4, prior to placement of socket 60 in aperture 70, a layer of solder 105 is printed or otherwise deposited on ring 80. At this time, any other conductive lands on surface 75A are covered with solder in preparation for later solder reflow.

Figure 6:
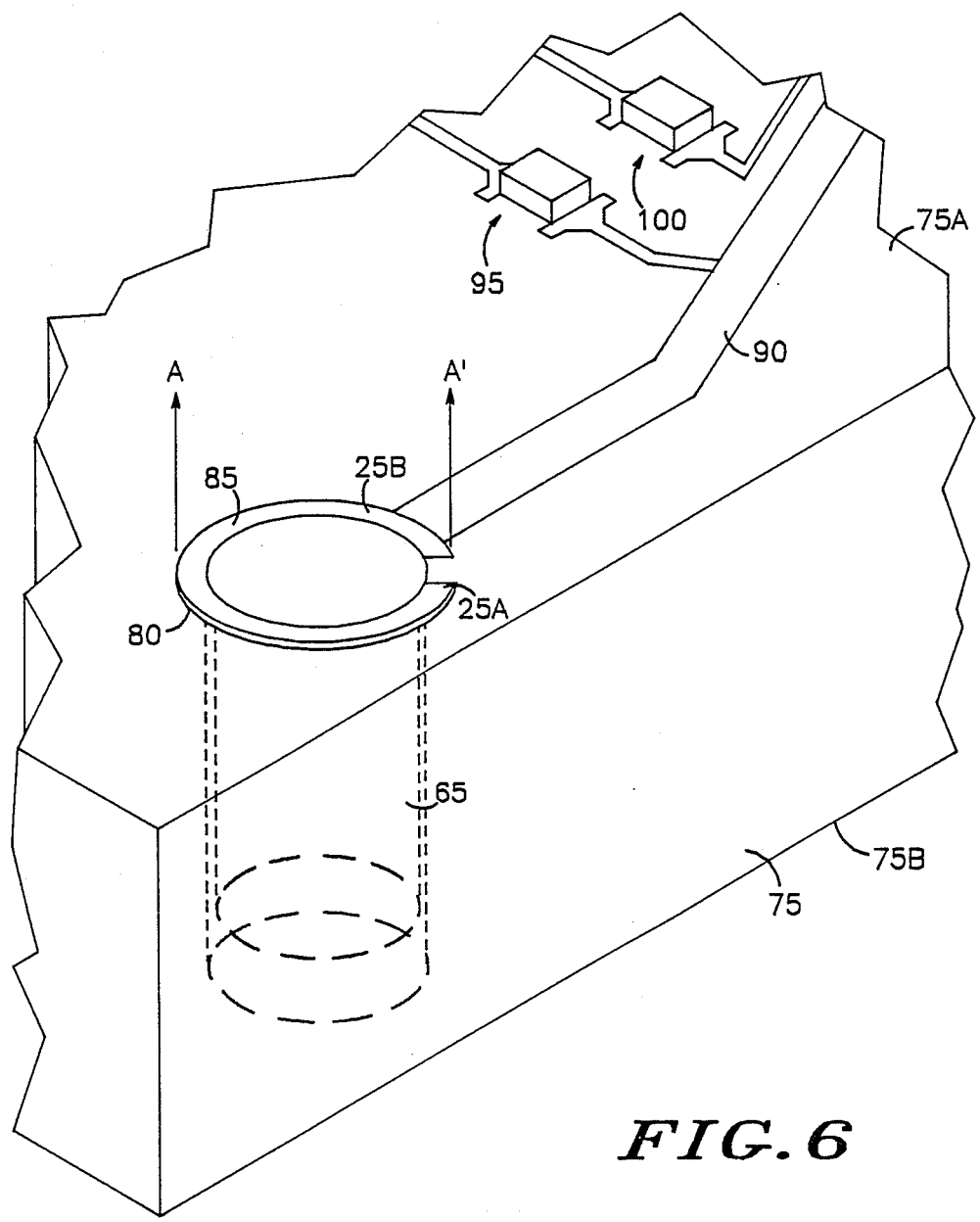
FIG. 6 is a perspective view of the connector socket of the invention shown after insertion in an aperture in a substrate.
Figure 7:
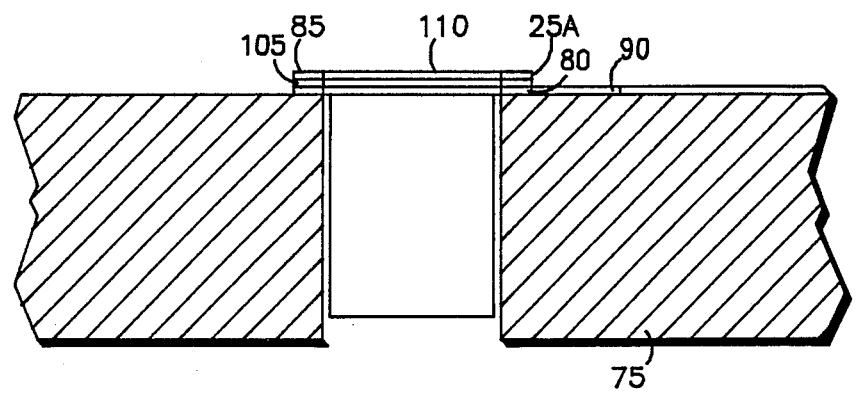
FIG. 7 is sectional view of the connector socket of FIG. 6 along section line A-A' prior to removal of the temporary housing.

Substrate 75 is then populated with socket 60 at aperture 70 and other surface mounted devices at sites 95 and 100 as seen in the cutaway perspective view of FIG. 6. The automatic placement machine shears upper spine 50 (shown in FIG. 5) from the remainder of socket 60 prior to insertion of socket 60 into aperture 70. The rim 85 formed by arm pair 25A-25B rests on solder layer 105 which is atop ring 80 as shown in FIG. 7. FIG. 7 is a sectional view of socket 60 and substrate 75 along section line A-A' of FIG. 6. Solder layer 105 is more clearly shown in FIG. 7.

The populated substrate 75 is then subjected to a solder reflow environment. That is, substrate 75 is inserted into an oven which exhibits a temperature sufficiently high to cause the solder on the lands of substrate 75 and solder layer 105 to melt or reflow. When reflow occurs, a permanent electrical connection is formed between rim 85 and conductive ring 80. While solder reflow was occurring, temporary housing 65 acted as a shield which prevented solder from contacting arm pairs 21A-21B, 22A-22B, 23A-23B and 24A-24B. During reflow, permanent electrical connections are formed between the lands at sites 95 and 100 and respective surface mounted devices.

Temporary housing 65 is removed to expose arm pairs 21A-21B, 22A-22B, 23A-23B and 24A-24B to make them accessible for connection purposes. That is, the populated reflowed substrate 75 is subjected to a solvent capable of dissolving the particular soluble material selected for temporary housing 65. For example, when TC-561 is selected as the soluble material for temporary housing 65, then warm water is an example of one solvent which may be selected to dissolve and remove temporary housing 65. Also by way of example, when RR-490 manufactured by Lancer Chemical is selected as the soluble material for temporary housing 65, then Freon TMS TM manufactured by DuPont is an example of another solvent which may be selected to dissolve and remove temporary housing 65 from socket 60. Those skilled in the art will appreciate that temporary housing material/solvent combinations other than those given in the examples above may be employed in practicing the invention.

The populated reflowed substrate 75 is defluxed to remove flux residues associated with reflow soldering. This defluxing step is accomplished by subjecting the populated substrate 75 to a defluxing agent such as Freon TMS TM. The invention includes an embodiment wherein the temporary housing 65 is fabricated from a material selected to be soluble in the defluxing agent used to deflux the populated substrate after solder reflow. In this manner, the step of defluxing the reflowed substrate 75 simultaneously achieves the dissolving of temporary housing 65. For example, when temporary housing 60 is fabricated from RR-490, the defluxing agent Freon TMS TM, is used to remove temporary housing 60 and to deflux the populated reflowed substrate 75. Alternatively, the removal of temporary housing 65 and the defluxing of reflowed substrate 75 can be carried out in separate steps if desired. In that case, the material of temporary housing 65 is selected to be soluble in a solvent other than the defluxing agent.

Figure 8:
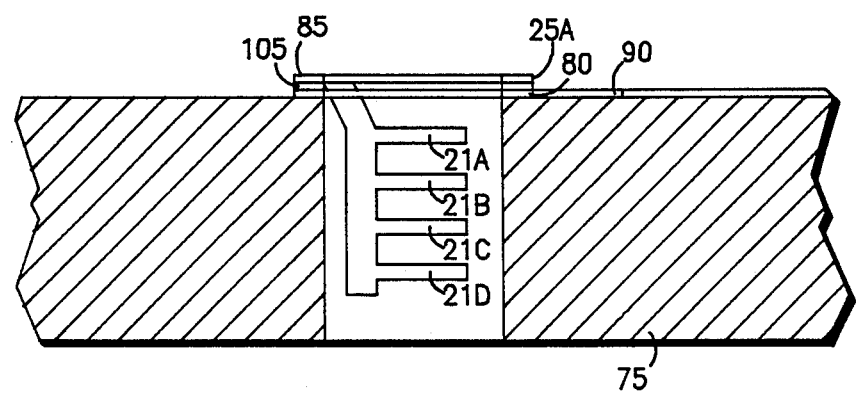
FIG. 8 is sectional view of the connector socket of FIG. 6 along section line A-A' after removal of the temporary housing.
Figure 9:
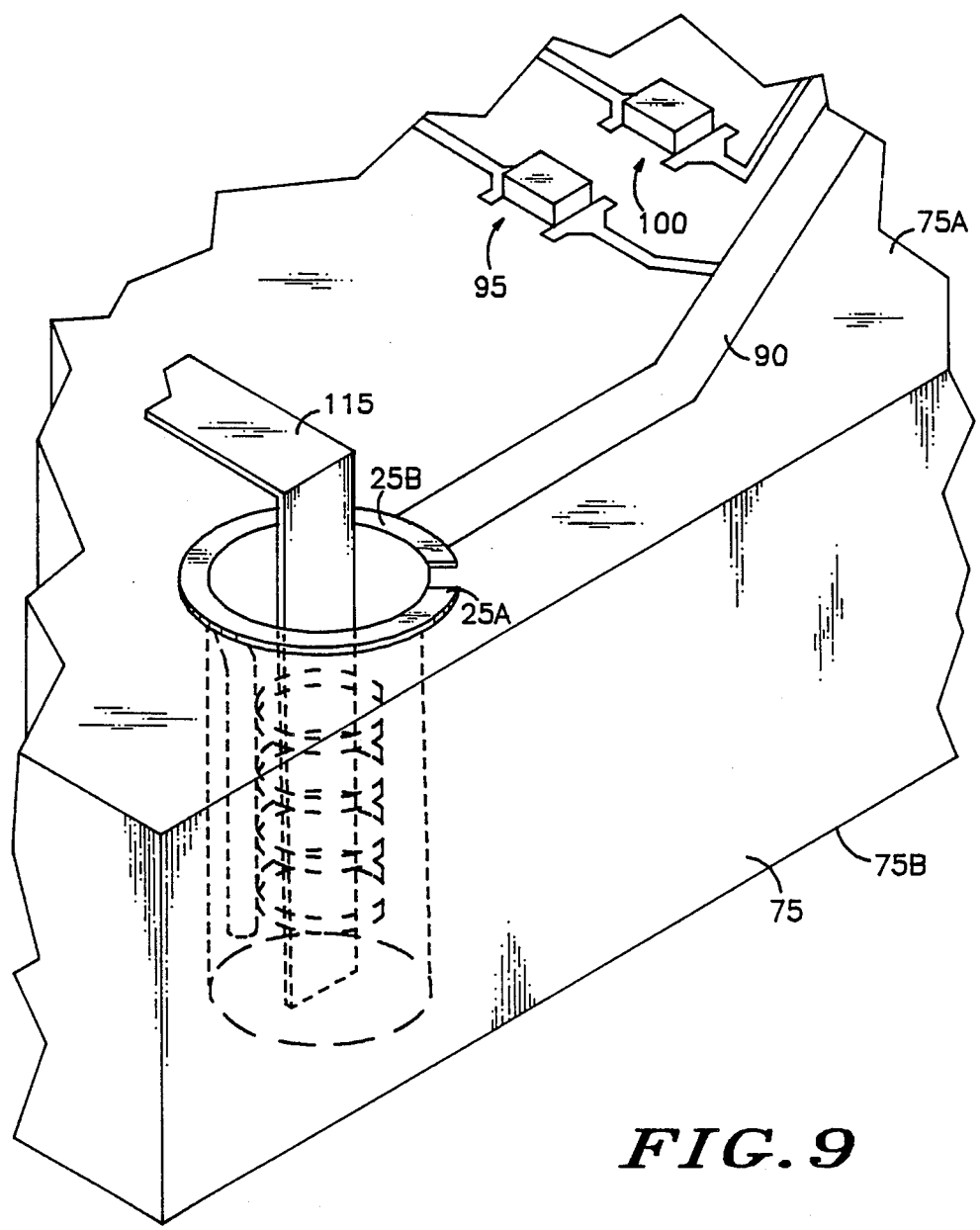
FIG. 9 is a cutaway perspective view of the installed socket with a lead therein.

After the reflowed substrate 75 is defluxed and the temporary housing 65 is removed from socket 60, socket 60 appears as in the sectional view of FIG. 8. It is seen that arm pairs 21A-21B, 22A-22B, 23A-23B and 24A-24B are now free to accept a component lead 115 or other lead therein. Such a lead is grasped between the arms of the respective arm pairs. The perspective cutaway view of substrate 75 in FIG. 9 more clearly shows arm pairs 21A-21B, 22A-22B, 23A-23B and 24A-24B gripping and making connection to lead 115 therein.

From the above description, it is clear that the invention includes a method for installing a socket having a plug connecting element mounted in a soluble temporary housing. The socket is installed in a substrate having at least one aperture for receiving the socket in accordance with the method the step of inserting the plug connecting element of the socket into the aperture. The method further includes the step of soldering a portion of the plug connecting element to a conductor on the substrate. The method includes the step of removing the temporary housing with an appropriate solvent. An electrical lead is then inserted into the connecting element of the socket.

The foregoing has described a socket apparatus for a printed circuit board or other substrate which consumes a minimal amount of volume on the substrate. The socket includes a temporary housing which can be removed to free-up valuable space on the substrate and adjacent to the substrate.

While only certain preferred features of the invention have been shown by way of illustration, many modifications and changes will occur to those skilled in the art. For example, the location and shape of temporary housing 65 is not limited to that illustrated in the drawings. Temporary housing 65 may be located on socket 60 at locations other than that shown as long as housing 65 provides a handle which is accessible for an automatic parts placement machine to grip. Moreover, temporary housing may exhibit a shape other than that illustrated as long as the selected shape exhibits sufficient structural integrity to enable an automatic parts placement machine to grip housing 65. In addition, the invention may be practiced with connector elements other than the particular connector element 10 which was shown for purposes of example. Those skilled in the art will appreciate that the temporary soluble housing or handle described herein may be attached to many different types of connector elements to enable such elements to be placed by an automatic parts placement machine. It is, therefore, to be understood that the present claims are intended to cover all such modifications and changes which fall within the true spirit of the invention.

I claim:

1. A socket for receiving an electrical lead therein, said socket being adapted for use on a substrate having at least one aperture, said socket comprising:
   connecting means for receiving said electrical lead and making an electrical connection to said electrical lead; and
   soluble housing means, attached to said connecting means, for temporarily housing said connecting means such that said soluble housing means prevents solder from reaching inside said aperture when said connecting mean inserted into said aperture during a soldering operation, said soluble housing means being removable via solvent from said connecting means after said soldering operation.

2. A socket for receiving an electrical lead therein, said socket being adapted for use on a substrate having at least one aperture, said socket comprising:
   connecting means for receiving said electrical lead and making an electrical connection to said electrical lead: and
   soluble housing means, attached to said connecting means, for temporarily housing said connecting means such that said soluble housing means prevents solder from reaching said connecting means during a soldering operation said soluble housing means being removable via solvent from said connecting means once said connecting means is inserted into said aperture; said soluble housing means including handle means for providing a handle which an automatic component placement apparatus can grip to facilitate placement of said socket in said aperture.

3. A socket for receiving an electrical lead therein for use on a substrate having a top surface and at least one aperture, said socket comprising:
   connecting means for receiving said electrical lead therein and for making an electrical connection to said electrical lead; and
   soluble housing means, attached to said connecting means, for temporarily housing said connecting means, said soluble housing means being located on said connecting means so as to mask and protect said connecting means from soldering operations on the top of said substrate to prevent solder from reaching inside said aperture when said connecting means is situated in said aperture, said soluble housing means being removable via solvent from said connecting means once said connecting means is inserted into said aperture and said soldering operations have ceased.

4. A socket for receiving an electrical lead therein, said socket being adapted for use on a substrate having at least one aperture, said aperture being at least partially framed by solder receptive material, said socket comprising:
   connecting means having a top section for soldering to said solder receptive material and a bottom section for receiving said electrical lead and making an electrical connection to said electrical lead; and
   soluble housing means, attached to said connecting means, for temporarily housing said connecting means such that said soluble housing means prevent a solder from reaching said bottom section of said connecting means when inserted into said aperture during a soldering operation, said soluble housing means being removable via solvent from said connecting means once said connecting means is inserted into said aperture and said top section is soldered to said solder receptive material.

* * * * *

UNITED STATES PATENT AND TRADEMARK OFFICE
CERTIFICATE OF CORRECTION

PATENT NO. : 4,878,851

DATED : Nov. 7, 1989

INVENTOR(S) : Mullen, III

It is certified that error appears in the above-identified patent and that said Letters Patent is hereby corrected as shown below:

Column 5, line 21, for the claim 1 portion of the claim reading "mean" should read --means is-- line 31 for the claim 2 the punctuation mark ":" should be a --;-- instead;

Column 6, lines 34 and 35, that portion of claim 4 reading "prevent a" should read --prevents--.

Signed and Sealed this

Twenty-fourth Day of September, 1991

Attest:

HARRY F. MANBECK, JR.

Attesting Officer

Commissioner of Patents and Trademarks